(12) United States Patent
De Ridder et al.

(10) Patent No.: US 8,099,190 B2
(45) Date of Patent: Jan. 17, 2012

(54) APPARATUS AND METHOD FOR TRANSFERRING TWO OR MORE WAFERS WHEREBY THE POSITIONS OF THE WAFERS CAN BE MEASURED

(75) Inventors: Christianus Gerardus Maria De Ridder, Hoogland (NL); Theodorus Gerardus Maria Oosterlaken, Oudewater (NL)

(73) Assignee: ASM International N.V., Bilthoven (NL)

( * ) Notice: Subject to any disclaimer, the term of this patent is extended or adjusted under 35 U.S.C. 154(b) by 1235 days.

(21) Appl. No.: 11/821,538

(22) Filed: Jun. 22, 2007

(65) Prior Publication Data

US 2008/0319559 A1 Dec. 25, 2008

(51) Int. Cl.
*G06F 19/00* (2011.01)
*G06F 7/00* (2006.01)
*G01N 21/86* (2006.01)
*G01V 8/00* (2006.01)

(52) U.S. Cl. ........... 700/245; 250/559.12; 250/559.3; 250/559.33; 250/559.36; 414/935; 414/936; 414/937; 414/938; 414/939; 700/213

(58) Field of Classification Search ............ 250/559.12, 250/559.3, 559.33, 559.36; 414/935, 936, 414/937, 938, 939, 941; 700/213, 245; 702/150, 702/155, 33, 35, 36; 73/1.79, 164, 865.8
See application file for complete search history.

(56) References Cited

U.S. PATENT DOCUMENTS

| | | | | |
|---|---|---|---|---|
| 5,225,691 A * | 7/1993 | Powers et al. | ............... | 250/559.4 |
| 5,319,216 A * | 6/1994 | Mokuo et al. | ............... | 250/559.4 |
| 5,466,945 A * | 11/1995 | Brickell et al. | ........... | 250/559.12 |
| 5,556,147 A * | 9/1996 | Somekh et al. | ............... | 294/64.1 |
| 5,563,798 A * | 10/1996 | Berken et al. | ................. | 700/218 |
| 5,565,034 A * | 10/1996 | Nanbu et al. | .................... | 118/668 |
| 5,604,443 A * | 2/1997 | Kitamura et al. | ........ | 324/750.16 |
| 5,626,456 A * | 5/1997 | Nishi | ............................ | 414/404 |
| 5,644,400 A * | 7/1997 | Mundt | ......................... | 356/400 |
| 5,697,748 A * | 12/1997 | Somekh et al. | ............... | 414/217 |
| 5,768,125 A | 6/1998 | Zinger et al. | | |
| 5,870,488 A * | 2/1999 | Rush et al. | .................... | 382/151 |
| 5,905,850 A * | 5/1999 | Kaveh | ........................... | 700/259 |
| 5,972,110 A * | 10/1999 | Akimoto | ......................... | 118/52 |
| 6,162,008 A * | 12/2000 | Perkins et al. | ................. | 414/754 |
| 6,275,742 B1 * | 8/2001 | Sagues et al. | ................. | 700/213 |
| RE37,470 E * | 12/2001 | Ohkura et al. | ................ | 396/604 |
| 6,339,730 B1 * | 1/2002 | Matsushima | ................ | 700/218 |
| 6,405,101 B1 * | 6/2002 | Johanson et al. | ............ | 700/218 |
| 6,450,755 B1 * | 9/2002 | Cameron et al. | ......... | 414/416.08 |
| 6,516,244 B1 * | 2/2003 | Yoo et al. | ...................... | 700/218 |
| 6,567,725 B1 * | 5/2003 | Wilkey et al. | ................. | 700/264 |

(Continued)

*Primary Examiner* — John Nguyen
*Assistant Examiner* — Nicholas Kiswanto
(74) *Attorney, Agent, or Firm* — Weingarten, Schurgin, Gagnebin & Lebovici LLP

(57) ABSTRACT

A method and an apparatus for transferring a substantially flat and substantially circular objects, such as wafers, from a pick-up position to a delivery position, the apparatus comprising, a manipulator, at least one source for emitting a source signal, at least one sensor for sensing said source signal and for providing a sensor signal, a computing device arranged for processing at least one sensor signal to obtain data on the position of said object, the manipulator being arranged for simultaneously transferring a first and a second object along a path in a substantially parallel orientation, spaced apart from each other, and substantially co-axially whereby the central axis of each object may be displaced radially, a said source and a said sensor are connected by a virtual line, whereby the virtual line includes an angle with the central axes of the first and second objects.

19 Claims, 6 Drawing Sheets

U.S. PATENT DOCUMENTS

| | | | |
|---|---|---|---|
| 6,629,053 B1 * | 9/2003 | Mooring | 702/94 |
| 6,709,522 B1 * | 3/2004 | Condrashoff et al. | 118/719 |
| 6,729,462 B2 * | 5/2004 | Babbs et al. | 198/346.2 |
| 6,799,940 B2 * | 10/2004 | Joe et al. | 414/672 |
| 6,856,858 B2 * | 2/2005 | Kurita | 700/218 |
| 6,860,790 B2 * | 3/2005 | Dvir | 451/5 |
| 6,992,316 B2 * | 1/2006 | Kurita | 250/559.29 |
| 7,008,802 B2 * | 3/2006 | Lu | 438/7 |
| 7,027,894 B2 * | 4/2006 | Kretz et al. | 700/258 |
| 7,248,931 B2 * | 7/2007 | Raaijmakers | 700/57 |
| 7,331,751 B2 * | 2/2008 | Tamura | 414/805 |
| 7,458,469 B2 * | 12/2008 | Hosaka et al. | 211/41.18 |
| 7,596,456 B2 * | 9/2009 | Mollenkopf et al. | 702/34 |
| 7,880,155 B2 * | 2/2011 | Krupyshev et al. | 250/559.3 |
| 2002/0131848 A1 * | 9/2002 | Kurata | 414/217 |
| 2004/0167743 A1 * | 8/2004 | Hosek | 702/155 |
| 2005/0110974 A1 * | 5/2005 | Hashimoto et al. | 355/72 |
| 2007/0126898 A1 * | 6/2007 | Feldman et al. | 348/294 |

* cited by examiner

APPARATUS AND METHOD FOR TRANSFERRING TWO OR MORE WAFERS WHEREBY THE POSITIONS OF THE WAFERS CAN BE MEASURED

FIELD

This invention relates to the field of semiconductor processing and more in particular to measuring the position of a wafer while it is being transferred by a wafer transfer robot.

BACKGROUND

An apparatus for transferring a wafer comprising displaceable transferring means for engaging the wafer and means for determining a horizontal position of the wafer relative to said displaceable transferring means is described by U.S. Pat. No. 5,768,125, hereafter referred to as Zinger et al. and assigned to applicant, the subject matter of which is incorporated herein by reference in its entirety. Said apparatus comprises an array of light sensors positioned in the path of the wafer in a direction not parallel with the extension of said path. The light sensors detect the passage of the wafer edge. Calculation means are provided for determining the position of said article based on the output of said array of sensors.

The apparatus is capable of measuring the position of one wafer at a time. However, when loading a large batch of wafers in a wafer boat, the loading process takes a significant amount of time. It would be desirable to be able to load two or more wafers simultaneously in one loading movement of the wafer transfer robot without sacrificing the capability of measuring the position of each wafer being transferred. It is the object of the present invention to provide a solution for this problem and to provide an apparatus for transferring wafers comprising displaceable transferring means capable of transferring two or more wafers simultaneously while measuring the positions of the two or more wafers relative to the displaceable transferring means.

SUMMARY

To this end the invention provides an apparatus for transferring a substantially flat and substantially circular object, such as a wafer, from a pick-up position to a delivery position, the apparatus comprising:
 a manipulator;
 at least one source for emitting a source signal;
 at least one sensor for sensing said source signal and for providing a sensor signal; and
 a computing device arranged for processing at least one sensor signal to obtain data on the position of said object;
the manipulator being arranged for simultaneously transferring a first and a second object along a path, said objects being substantially flat, substantially equally sized, and substantially circular, each object having a main surface and a central axis extending perpendicular to the main surface through the center of the object, the objects being carried by the manipulator in a substantially parallel orientation, spaced apart from each other, and substantially co-axially whereby the central axis of each object may be displaced radially, the sum of the number of sources and the number of sensors being at least three, whereby a said source and a said sensor are connected by a virtual line, said source and said sensor being positioned such that, both the first and the second object intersect the virtual line during a transfer of said objects along said path, whereby the virtual line includes an angle with the central axes of the first and second objects.

The invention also provides a method comprising the steps of
 providing at least two substantially flat, substantially equally sized and substantially circular objects, each object having a main surface and a central axis extending perpendicular to the main surface through the center of the circular object;
 providing an apparatus according to the invention, comprising a source and a sensor which are connected by a virtual line, said source and said sensor being positioned such that, both the first and the second object intersect the virtual line during a transfer of said objects along said path, whereby the virtual line includes an angle with the central axes of the first and second objects;
 the picking up of said objects by said manipulator at a pick-up position;
 the transfer of said objects by the manipulator along said path whereby at least two of said objects each interrupt the at least one source signal, whereby the computing device processes the sensor signal of the at least one sensor to obtain data on the positions of said objects.

A manipulator picks up at least two substantially flat, substantially equally sized, and substantially circular objects from a pick-up position, and transfers these objects simultaneously, in a stacked fashion, yet spaced apart from each other, along a path leading to a delivery position, where the objects may be delivered. Ideally, the objects would be transferred perfectly co-axially, i.e. with the central axes of all objects coinciding. In practice however, the objects may be radially displaced relative to the desired position. The extent to which an object may be radially displaced is always limited and may reasonably be expected not to exceed a certain value dependent on, for example, the factual design of the apparatus such as the design of an object holder at the pick-up position and the circumstances under which the apparatus is operating.

To obtain information about the positions of the objects being transferred, and thus about the radial displacement of these objects, a minimal amount of data is necessary. The position of a flat, circular object may for example be determined from a set of data comprising no more than the coordinates of two points on its circumferential edge and its radius. In case the radius of the objects to be transferred is known in advance, which is likely for most industrial applications, the coordinates of only two points on the circumferential edge of an object need to be measured to determine its position.

To obtain the position of two objects being transferred in a stacked fashion, the present invention uses a source and a sensor positioned such that the virtual line connecting them is intersected by both the objects during transfer along said path. An intersection of the virtual line corresponds to an interruption or change of the source signal sensed by the sensor, which interruption will be communicated by the sensor to the computing device through its sensor signal.

When intersected, the virtual line includes an angle with the central axes of the objects. The non-perpendicular intersection of the virtual line by the objects allows the computing device to determine which of the objects is proximal and which is distal to the sensor, and thus which of the objects is causing the intersection. It is to be noted that the information produced by the intersection of said virtual line by said objects alone does not yield enough data to determine the position of the two objects. Additional data is therefore required, which data can be gathered using at least a second source or a second sensor, depending on the desired design of the apparatus. In other words, the sum of the number of sensors and the number of sources may at least be three.

When, for example, an array of source/sensor combinations is provided of which combinations the respective virtual connection lines are perpendicular to the main surfaces of the objects, a top plan view of intersection points on the circumferential edges of the objects can be obtained. Thus the two circumferential edges and therewith the centers of these objects can be determined. However, when two objects are being transferred in a stacked fashion, on the basis of this information alone it can not be determined which of the measured intersection points belong to either object. With the source/sensor combination of which the virtual connection line is non-perpendicular to the main surfaces of the objects, two additional intersection points can be obtained. By combining the space and time coordinates of these intersection points with the space and time coordinates of the other intersection points, and by using the knowledge of the non-perpendicular angle of the virtual connection line, it can be determined which of the measured intersection points correspond to which object.

In case more than two objects are simultaneously moved in a substantial co-axial, spaced apart relation, the position of each of the objects can be determined with the aid of a number of source/sensor-combinations, whereby a virtual line non-perpendicular to the main surfaces connects each source to a corresponding sensor.

According to a further elaboration, said angle is so large that during transfer of said objects along said path the virtual line only intersects the circumferential edge of the first object at a certain instance, and the virtual line only intersects the circumferential edge of the second object at another instance.

Given the maximally possible radial displacement of an object and the minimum distance by which two objects are spaced apart, it is possible to configure the angle included by the virtual line and the central axes of the objects such that the circumferential edge of the first object exclusively intersects the virtual line at a certain instance, and such that the circumferential edge of the second object exclusively intersects the virtual line at another instance, under all regular operating conditions. Configuring the angle such ensures the measurement of the coordinates of one point on the circumferential edge of either object, and more importantly, fixes the order in which the exclusive intersections by the first and the second object take place. This simplifies the data processing for establishing the centers of the objects.

According to an embodiment, the apparatus comprises at least two sources and at least one sensor, a first virtual line connecting a first source to the at least one sensor, a second virtual line connecting a second source to the at least one sensor, whereby said sources and said sensor are positioned such that, during a transfer of said objects along said path, the first as well as the second virtual line intersects said first and said second object.

In another embodiment, the apparatus comprises at least one source and at least two sensors, a first virtual line connecting the at least one source to a first sensor, a second virtual line connecting the at least one source to a second sensor, whereby said source and said sensors are positioned such that, during a transfer of said objects along said path, the first as well as the second virtual line intersects said first and said second object.

With such configurations a sufficient amount of data, i.e. a sufficient number of measured intersection points, can be obtained to determine the positions of two objects with a minimal number of components.

According to a further elaboration, a said source is a light source and the corresponding sensor is a light sensor.

Light sources are easy to obtain, relatively cheap and reliable, while light itself does not necessarily damage an object when it strikes it. Alternatively, other types of sources and corresponding sensors may be used, for example sources for producing, and sensors for sensing, sound.

According to a further elaboration, the source signal of said source is a confined beam of light.

A source signal being a confined beam of light can easily be prevented from reaching a sensor by positioning an object in between the source and the sensor, causing a distinct change in the input of the sensor. Also, since beams of light can be aimed, specific sources may be selected to cooperate with specific sensors. Thus interference of source signals can be prevented and the sensors may be of a relatively simple on/off-type.

According to a further elaboration, the apparatus may comprise an array of said sensors.

Combining multiple sensors into an array of sensors may offer manufacturing advantages, and increases the accuracy up to which the relative positions of the objects can be determined.

According to a further elaboration, the array of sensors is substantially linear and oriented in a direction not parallel to the path.

Also non-linear arrays are feasible.

Orienting an array of sensors in a direction not parallel to the path allows multiple measurements to be taken of coordinates of points on the circumferential edge of the transferred objects, thereby outlining the circumferential edges and providing redundant information that may be used to improve the accuracy of the calculation to be performed by the computing device.

According to a further elaboration, the manipulator is provided with at least one reference mark for interaction with a source signal.

One may wish to gather information about the movements of the manipulator by taking measurements. To facilitate these measurements the manipulator may be provided with a reference mark for interaction with a source signal. In case the source signal is a confined beam of light, the reference mark may, for example, be a serrated extremity that, when interacting with the source signal, blocks the signal repeatedly for set intervals. A sensor, positioned to receive the source signal, may register the interruptions of the signal and communicate the information to a computing device for processing. Note that information about the movement of the manipulator may be crucial or simply of value to the task of determining the positions of the objects being transferred, depending on how much information is being collected. In particular the speed of the manipulator may be taken into account by the computing device to determine the positions of the objects.

According to a further elaboration, the apparatus comprises a controller arranged to use data from the computing device to control the movement of the manipulator.

A controller arranged to use data from the computing device allows the information about the positions of the objects calculated by the computing device to be used immediately to adjust the movement of the manipulator. When, for example, measurements indicate that all objects are systematically displaced over of a certain distance, the controller may instruct the manipulator to deliver the objects to a corrected delivery position, thus counterbalancing the systematic displacement.

According to a further elaboration, the controller is capable of outputting operational information, such as the position and speed of the manipulator, for processing by the computing device.

A controller capable of outputting operational information to the computing device may supply said device with accurate information that otherwise would have to be measured externally.

According to a further elaboration, the controller is arranged to halt the movement of the manipulator when the radial displacement of at least one of the objects is larger than a predefined value.

Occasionally, the manipulator may faultily pick up an object. As a result the object may, for example, have a radial displacement that causes instability, or a radial displacement that prevents the object from being delivered properly to its delivery position. In such cases, the controller may automatically halt the movement of the manipulator, ensuring that no harm is done to either the apparatus or the objects being transferred.

According to a further elaboration, the manipulator comprises at least two end effectors, each for carrying one object, the relative positions of said end effectors being adjustable by the controller.

A manipulator provided with end effectors that can be moved relative to each other by the controller, allow the controller to align the objects on the fly in case of radial displacements.

DETAILED DESCRIPTION OF THE DRAWINGS

Figure 1A:
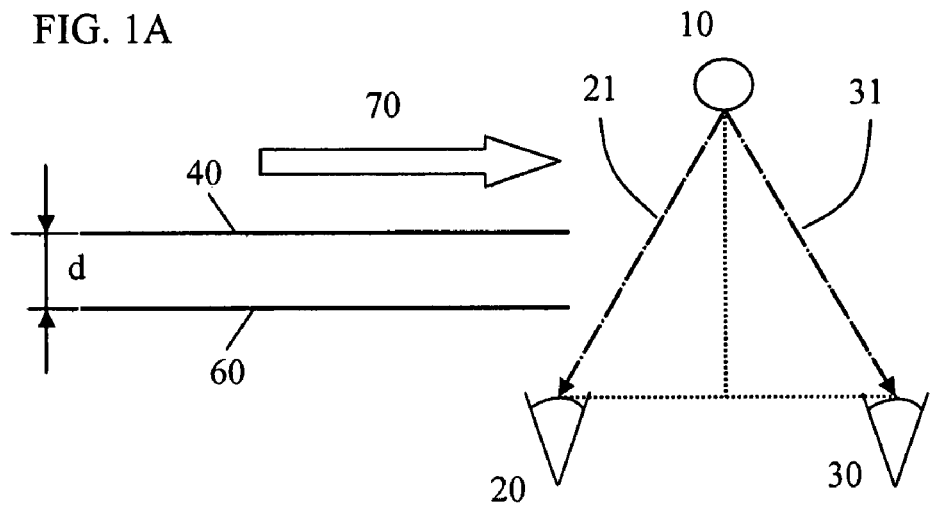
FIGS. 1A-1F show a first embodiment of the invention.

FIGS. 1A-1F illustrate the sensor configuration of an embodiment of the present invention. Although other embodiments of the invention may advantageously use an array of sensors, for ease of illustration the principle of the invention will be explained in FIGS. 1A-1F using two sensors. In FIGS. 1A-1F a wide angle light source is indicated by reference 10, and detectors are indicated by 20 and 30. Light source 10 and light detectors 20 and 30 are positioned relative to each other and configured such that preferably confined beams 21 and 31 of light emitted by light source 10 are detected by detectors 20 and 30 respectively. Light source 10 and detectors 20 and 30 are positioned in the path of the wafers such that the light beams 21 and 31 will be interrupted during the passage of each of the wafers 40 and 60. Detectors 20 and 30 are horizontally spaced apart from each other and positioned horizontally spaced apart relative to light source 10 parallel to the direction of the wafer path 70 such that beams 21 and 31 include an angle with the normal to the main surface of wafers 40 and 60. More particularly, beams 21 and 31 each extend in a virtual plane which is perpendicular to the main surface of for example wafer 60, wherein the virtual plane includes a cross-section line defined by a cross-section of said main surface and the virtual plane, the angle α of beam 21 with a part of the cross-section line which is downstream of an intersection of beam 21 and the cross-section line being larger than 90°, and the angle β of beam 31 with a part of the cross-section line which is downstream of an intersection of beam 31 and the cross-section line being smaller than 90° (see FIG. 1D).

Figure 1B:
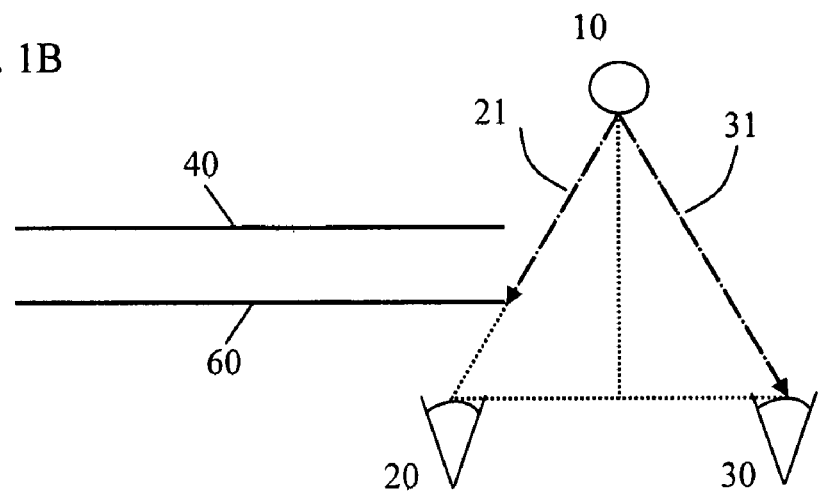
Figure 1C:
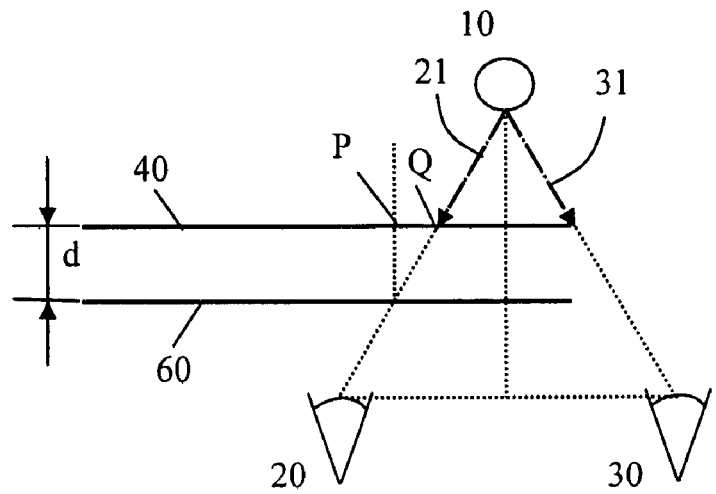
Figure 1D:
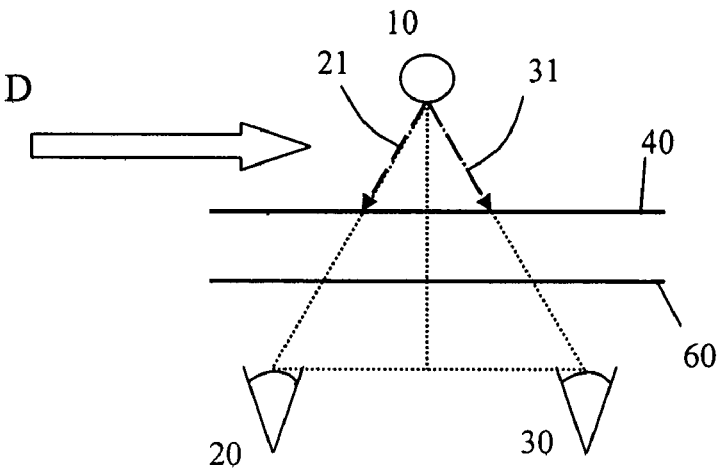
Figure 1E:
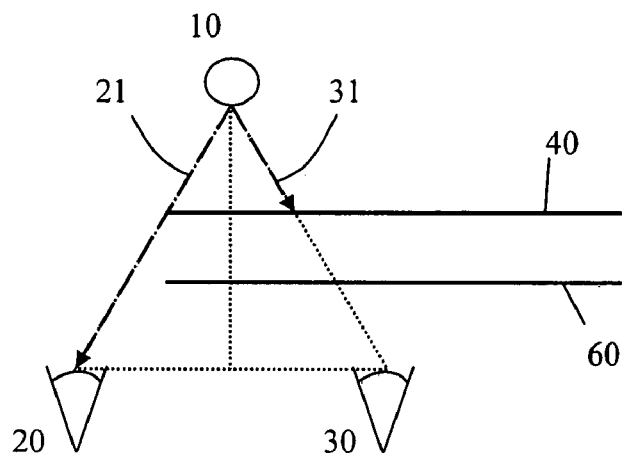

In FIG. 1A, the light beams 21 and 31 are both uninterrupted when the wafers are away from the light beams. In the shown example, the two wafers are aligned relative to each other, i.e. they are only spaced apart from each other vertically by a distance d. In FIG. 1B the wafers have moved on and the leading edge of lower wafer 60 has just interrupted light beam 21. In FIG. 1C the wafers have moved on further and the leading edge of upper wafer 40 has just interrupted the light beam 31. As the position as a function of time of the wafer end effector carrying the wafers and/or the speed of the wafers is known in principle, the expected times of interruption of the light beams detected by detectors 30 and detector 20 are known. A deviation of the actual times from the expected times indicates that the wafers are horizontally displaced relative to a desired position. In FIG. 1D it is shown that the wafers 40 and 60 are in a centre position and both light beams 21 and 31 are interrupted. In FIG. 1E, the trailing edge of upper wafer 40 has just ended its intersection of light beam 21 and in FIG. 1F the trailing edge of lower wafer 60 has just ended its intersection of light beam 31.

In an embodiment an array of detectors is used, the array extending in a direction not parallel to the direction of the wafer path 70. In Zinger et al. it is shown that, if a wafer does not exhibit a flat portion at its circumferential edge, measuring of one passage of one wafer edge with such an array of detectors is sufficient to determine the wafer position relative to a desired position. This means that in the position shown in FIG. 1B, the position of the lower wafer 60 can be measured using the interruption of array of beams 21 by the leading edge of lower wafer 60 and in the position shown in FIG. 1C the position of upper wafer 40 can be measured using the interruption of array of beams 31 by the leading edge of upper wafer 40. Alternatively, the position of the upper wafer can be measured in the position shown in FIG. 1E by measuring the termination of the interruption of array of light beams 21 by the trailing edge of upper wafer 40. Similarly, the position of lower wafer 60 can be measured in the position shown in FIG. 1F, by measuring the termination of interruption of beams 31 by the trailing edge of lower wafer 60. Obviously, using the measurement results of both beams 21 and 31 at both leading and trailing edges of the wafers provides some redundant information that improves the accuracy of the measurement.

Combining the information obtained from interruptions of the light beams by the wafer with information relating to the position of the manipulator as a function of time results in the position of the wafer on the manipulator. Information about the position of the manipulator as a function time may be derived from the robot controller, or may alternatively be measured by a second array of detectors, extending in the direction of the wafer path, as described by Zinger et al.

A problem may arise when the upper wafer 40 is displaced over such a large distance, for example in the forward direction, that the upper wafer 40 interrupts the light beam 21 before it is interrupted by the lower wafer 60. Assuming light source 10 and detectors 20 and 30 are positioned at the corners of an equilateral triangle, such a situation will occur in the present example when the wafer displacement is equal to or larger than PQ=d/√3, see FIG. 1C. The wafer spacing d is typically 7 mm or larger. This means that wafer displacements up to about 4 mm can still be detected in a normal routine, which is a pretty safe margin. Obviously, from the wafer position as a function of time information or the wafer speed as a function of time information it can be derived if the leading edge of either the upper or the lower wafer interrupts beams 21 as well as beams 31. Even in such a situation it can be determined which wafer interrupts both beams and what the position of this wafer is. For information about the position of the other wafer, the opposing edge of the wafers needs to be measured.

Figure 1F:
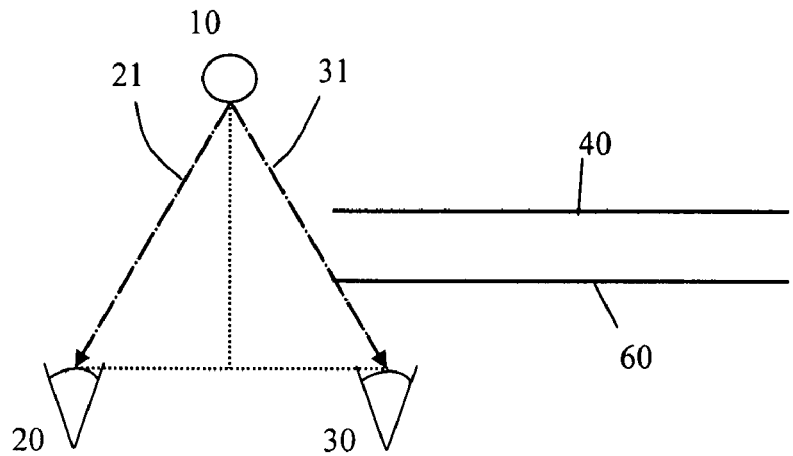
Figure 2A:
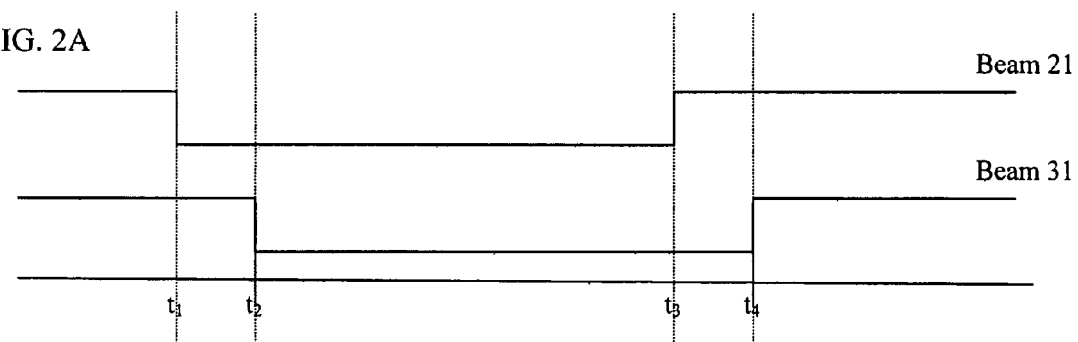
FIGS. 2A-2C schematically show the output signals of detectors 20 and 30 shown in FIGS. 1A-1F.
Figure 2B:
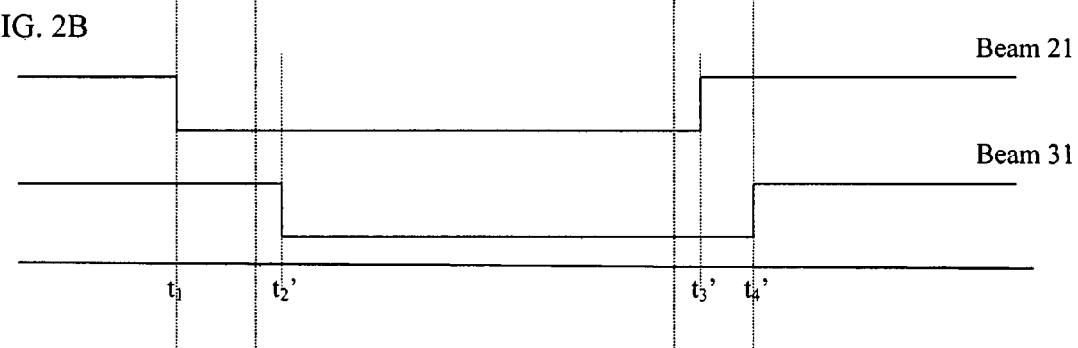
Figure 2C:
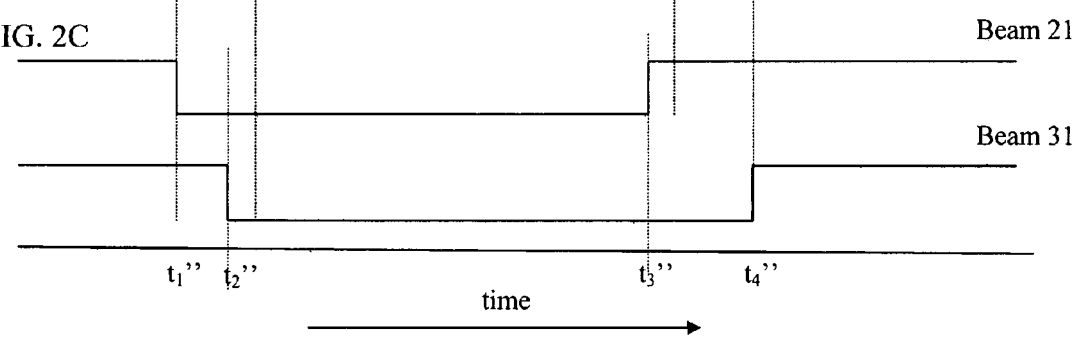

FIGS. 2A-2C illustrate the method of the present invention. FIG. 2A corresponds to a situation of perfectly aligned wafers. Time $t_1$ is the moment that the lower wafer interrupts the light beam 21, as shown in FIG. 1B and $t_2$ is the moment that the upper wafer interrupts the light beam 31, as shown in FIG. 1C. Time $t_3$ is the moment that the interruption by the upper wafer of the light beam 21 terminates, as shown in FIG. 1E and $t_4$ is the moment that the interruption by the lower wafer of the light beam detected by detector 31 terminates as shown in FIG. 1F. FIG. 2B represents a situation wherein upper wafer is shifted in a backward position relative to the lower wafer wherein we assume that the position of the lower wafer on the end effector is unchanged. Then, beam 31 will be interrupted at a later time $t_2'$ and the interruption of bean 21 terminates at a later time $t_3'$ as compared to the situation in FIG. 2A. FIG. 2C represents a situation wherein upper wafer 40 is shifted in a forward direction relative to the lower wafer. In this case, beam 31 will be interrupted at an earlier time $t_2''$ and the interruption of beam 21 terminates at an earlier time $t_3''$ as compared to the situation in FIG. 2A.

Figure 3A:
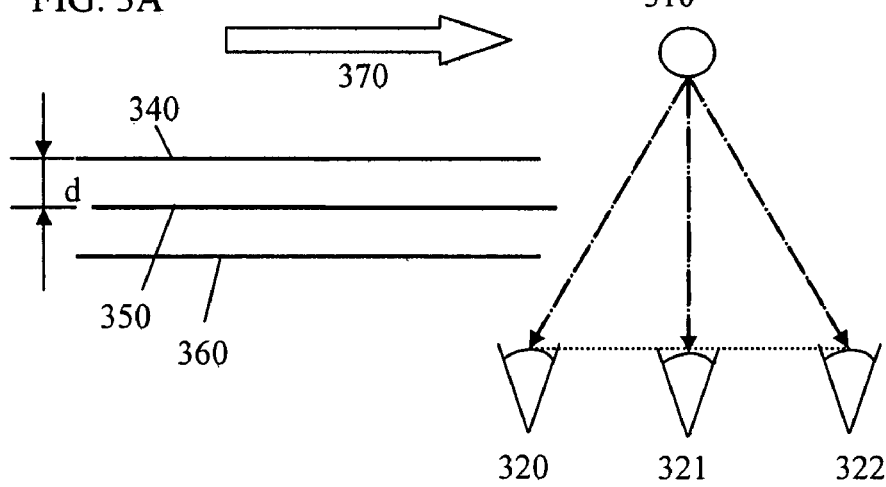
FIGS. 3A-3C show a second embodiment of the invention.
Figure 3B:
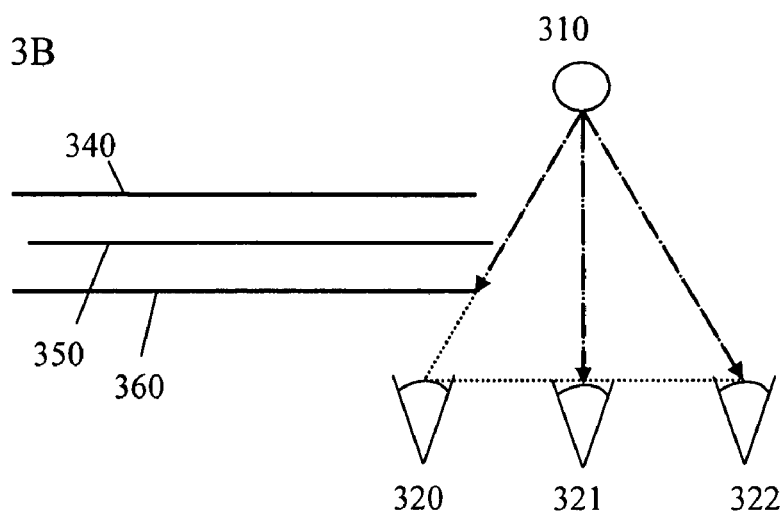
Figure 3C:
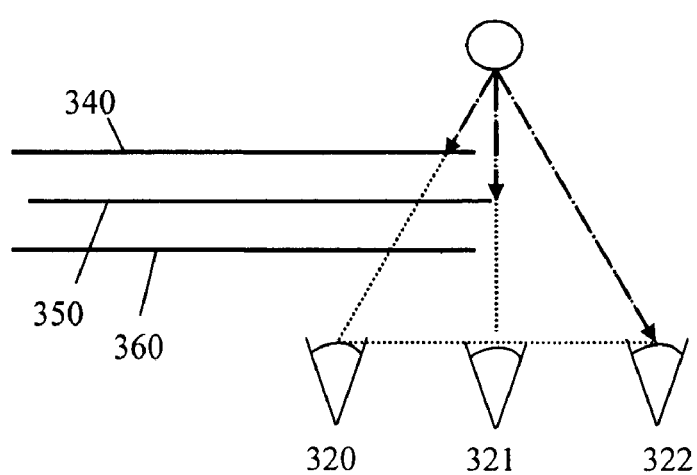

In FIGS. 3A-3C another embodiment is shown. A light source 310 and three different detectors 320, 321 and 322 are configured such and positioned such relative to each other that three light beams include different angles with the normal to a main wafer plane. In the example, three vertically stacked wafers 340, 350 and 360 are transferred in the direction of a wafer path 370. By using three beams more information is collected than using two beams. E.g. the most forward and backward wafers will be detected by a vertically oriented beam, irrespective of the position of the wafer in the stack. This way it is possible to obtain position information about each of the three wafers, especially when arrays of sensors and sources are used, extending in a direction non-parallel to the wafer path.

Figure 4B:
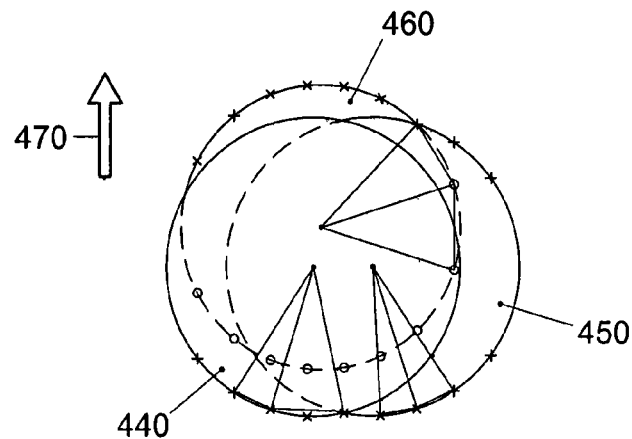
FIGS. 4A-4C illustrate the collection of intersection point data using an embodiment of the invention comprising an array of source/sensor combinations.
Figure 4B:
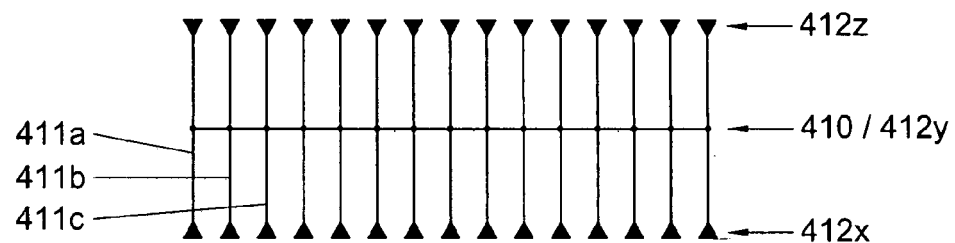
Figure 4A:
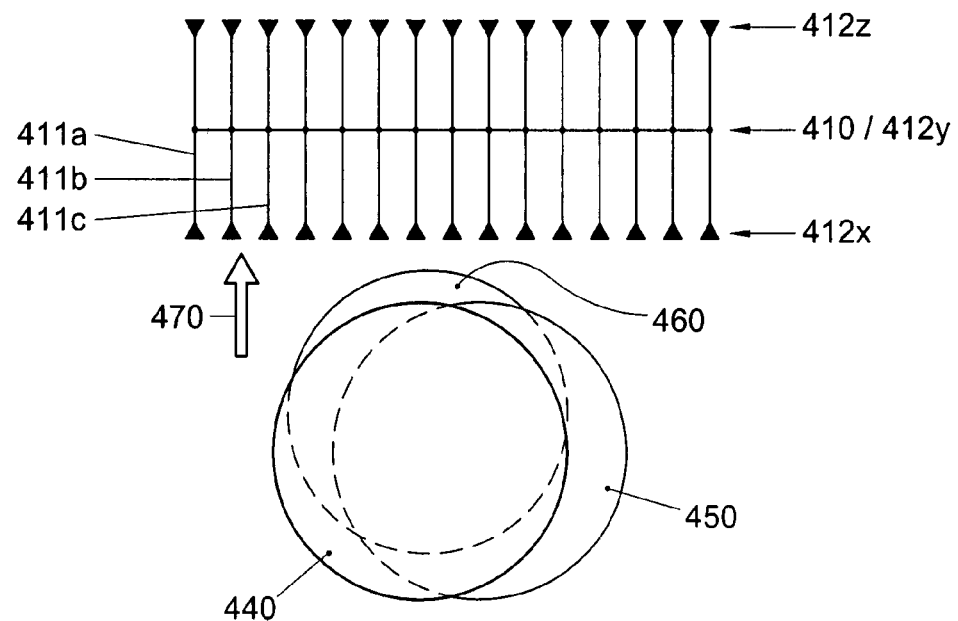
Figure 4C:
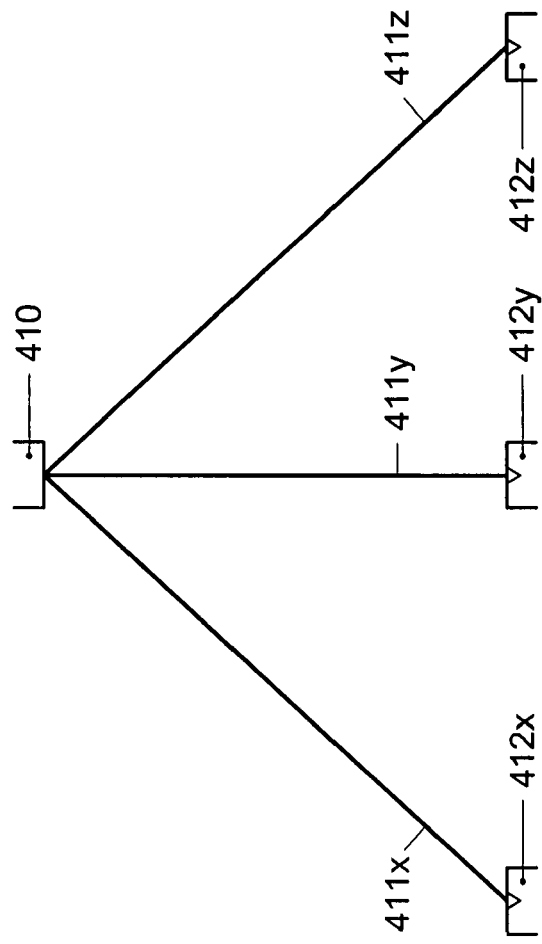
Figure 4C:
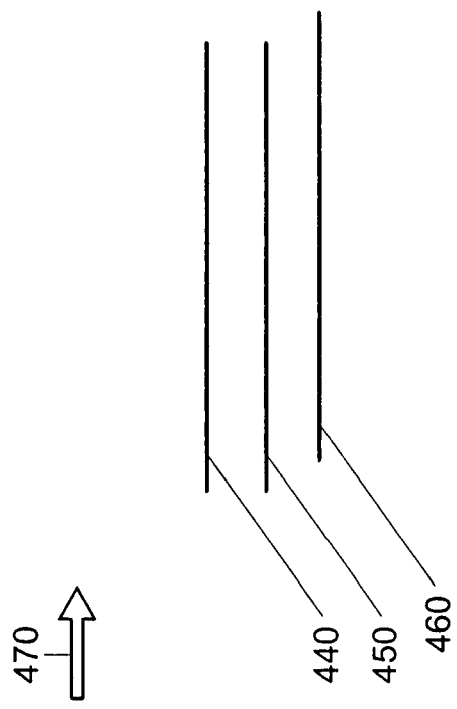

FIGS. 4A-4C illustrate the collection of intersection point data using an embodiment of the invention comprising an array of source/sensor combinations. FIG. 4A shows three vertically stacked wafers 440, 450, 460, viewed from above. The three wafers are radially displaced relative to each other. The stack as a whole is being transferred in the direction of a wafer path 470, and about to intersect the confined beams of light 411a, 411b, 411c etc. connecting linear arrays of sensors 412x, 412y, 412z (see FIG. 4C) below the wafers to a linear array 410 of sources located above the wafers whereby the different arrays extend in a direction non-parallel to the wafer path. The confined beams of light 411a, 411b, 411c etc. may include different angles with the central axes of the wafers 440, 450, 460. As the stack of wafers is transferred through the 'curtain' of beams of light, space and time coordinates of intersection points are collected, both when a beam of light is blocked and when a beam of light is unblocked by the wafers. FIG. 4B shows a number of intersection points the data of which may have been collected, x-marks indicating intersection points that may have been detected by beams of light perpendicular to the main surfaces of the wafers, o-marks indicating intersection points that may have been detected by beams of light that include an angle with the central axes of the wafers. FIG. 4C is a schematic side view of the situation depicted in FIG. 4A, also showing three linear arrays of sensors 412x, 412y and 412z.

When the positions of the two or more wafers being transferred have been detected, several options are open. When the deviations in the positions of the wafers from a desired position are within predefined limits, no corrective action may be needed. When the offset in positions are more than a predefined limit a correction may be necessary or the wafer transfer process can be halted. If two or more end effectors are in fixed positions relative to each other, it is only possible to perform a correction of the position for all wafers together. When the end effectors are moveable relative to each other, then a correction for each individual wafer can be performed.

In the examples shown in FIGS. 1A-1F and 3A-3C, a wide angle light source and multiple detectors per light source are shown wherein the detectors are configured to detect a confined beam of light and are positioned such to detect light emitted at various angles. Alternatively, it is possible to use for each angle of detection a dedicated light source, emitting a confined beam of light.

Although the present invention has been described by reference to several embodiments, it will be understood that numerous changes could be made within the spirit and scope of the inventive concepts described. In a practical embodiment, the apparatus may comprise an array of sources and a corresponding array of sensors, wherein each source and the sensor corresponding therewith are connected by a virtual line, said source and said sensor being positioned such that, both the first and the second object intersect the virtual line during a transfer of said objects along said path, whereby the virtual lines include an angle with the central axes of the first and second objects. Accordingly, it is intended that the invention not be limited to the disclosed embodiments, but that it includes the full scope permitted by the language of the following claims.

The invention claimed is:

1. Apparatus for transferring a substantially flat and substantially circular object, such as a wafer, from a pick-up position to a delivery position, the apparatus comprising:
  a manipulator;
  at least one light source for emitting a source signal, said source signal being a confined beam of light;
  at least one light sensor for sensing said source signal and for providing a sensor signal in response thereto; and
  a computing device arranged for processing at least one sensor signal to obtain data on the position of said object;
  the manipulator being arranged for simultaneously transferring a first and a second object along a path, said objects being substantially flat, substantially equally sized, and substantially circular, each object having a main surface and a central axis extending perpendicular to the main surface through the center of the object, the objects being carried by the manipulator in a substantially parallel orientation, spaced apart from each other, and substantially co-axially whereby the central axis of each object may be displaced radially; and
wherein a first virtual line connects the at least one source to a first sensor, and wherein a second virtual line connects the at least one source to a second sensor, the at least one source and the first and second sensors being positioned such that, both the first and the second object intersect the first and second virtual lines during a transfer of said objects along said path, whereby the virtual lines include an angle with respect to the central axes of the first and second objects.

2. Apparatus according to claim 1, wherein said angle is so large that during transfer of said objects along said path the virtual line only intersects the circumferential edge of the first object at a certain instance, and the virtual line only intersects the circumferential edge of the second object at another instance.

3. Apparatus according to claim 2, comprising at least two sources and at least one sensor, a first virtual line connecting a first source to the at least one sensor, a second virtual line connecting a second source to the at least one sensor, whereby said sources and said sensor are positioned such that, during a transfer of said objects along said path, the first as well as the second virtual line intersects said first and said second object.

4. Apparatus according to claim 2, comprising at least one source and at least two sensors, a first virtual line connecting the at least one source to a first sensor, a second virtual line connecting the at least one source to a second sensor, whereby said source and said sensors are positioned such that, during a transfer of said objects along said path, the first as well as the second virtual line intersects said first and said second object.

5. Apparatus according to claim 1, wherein the manipulator is provided with at least one reference mark for interaction with a source signal.

6. Apparatus according to claim 5, wherein at least one source and at least one corresponding sensor are positioned in said path, such that a passage of the at least one reference mark of the manipulator influences the sensor signal of said sensor.

7. Apparatus according to claim 6, wherein the computing device is arranged for processing the sensor signal of the at least one sensor that registers a passage of the at least one reference mark of the manipulator to obtain data on the position of the manipulator.

8. Apparatus according to claim 1, further comprising a controller for controlling the manipulator.

9. Apparatus according to claim 8, wherein the controller is arranged to use data from the computing device to control the movement of the manipulator.

10. Apparatus according to claim 9, wherein the controller is arranged to halt the movement of the manipulator when the radial displacement of at least one of the objects is larger than a predefined value.

11. Apparatus according to claim 9, wherein the manipulator comprises at least two end effectors, each for carrying one object, the relative positions of said end effectors being adjustable by the controller.

12. Apparatus according to claim 11, wherein the controller is arranged to adjust the position of at least one end effector when the radial position of at least one of the objects deviates from a desired position by more than a predefined value.

13. Apparatus according to claim 8, wherein the controller is capable of outputting operational information, such as the position and speed of the manipulator, for processing by the computing device.

14. Apparatus according to claim 1, wherein the first and the second virtual line each extend in a virtual plane which is perpendicular to the main surface of a said object, wherein the virtual plane includes a cross-section line defined by a cross-section of said main surface and the virtual plane, the angle of the first virtual line with a part of the cross-section line which is downstream of an intersection of the first virtual line and the cross-section line being larger than 90°, and the angle of the second virtual line with a part of the cross-section line which is downstream of an intersection of the first virtual line and the cross-section line being smaller than 90°.

15. Apparatus according to claim 14, whereby the angle included by the central axis and the first virtual line is so large that during transfer of said objects along said path the first virtual line intersects only the circumferential edge of the first object at a first instance, and the first virtual line intersects only the circumferential edge of the second object at a second instance, such that the first and the second instance do not coincide, and whereby the angle included by the central axis and the second virtual line is so large that during transfer of said objects along said path the second virtual line intersects only the circumferential edge of the first object at a third instance, and the second virtual line intersects only the circumferential edge of the second object at a fourth instance, such that the third and the fourth instance do not coincide.

16. Apparatus according to claim 15, wherein:
an array of said sensors is provided;
the array of sensors is substantially linear and extending in a direction not parallel to the path;
the manipulator is provided with at least one reference mark for interaction with a source signal;
at least one source and at least one corresponding sensor are positioned in said path, such that a passage of the at least one reference mark of the manipulator influences the sensor signal of said sensor;
the computing device is arranged for processing the sensor signal of the at least one sensor that registers a passage of the at least one reference mark of the manipulator to obtain data on the position of the manipulator;
a controller for controlling the manipulator is provided;
the controller is arranged to use data from the computing device to control the movement of the manipulator;
the controller is capable of outputting operational information, such as the position and speed of the manipulator, for processing by the computing device;
the controller is arranged to halt the movement of the manipulator when the radial displacement of at least one of the objects is larger than a predefined value;
the manipulator comprises at least two end effectors, each for carrying one object, the relative positions of said end effectors being adjustable by the controller;
the controller is arranged to adjust the position of at least one end effector when the radial position of at least one of the objects deviates from a desired position by more than a predefined value.

17. Method comprising the steps of
providing at least two substantially flat, substantially equally sized and substantially circular objects, each object having a main surface and a central axis extending perpendicular to the main surface through the center of the circular object;
providing an apparatus according to claim 16, comprising a source and a sensor which are connected by a virtual line, said source and said sensor being positioned such that, both the first and the second object intersect the virtual line during a transfer of said objects along said path, whereby the virtual line includes an angle with the central axes of the first and second objects;
the picking up of said objects by said manipulator at a pick-up position;
the transfer of said objects by the manipulator along said path whereby at least two of said objects each interrupt the at least one source signal, whereby the computing device processes the sensor signal of the at least one sensor to obtain data on the positions of said objects.

18. Apparatus for transferring a substantially flat and substantially circular object, such as a wafer, from a pick-up position to a delivery position, the apparatus comprising:
a manipulator;
an array of source/sensor-combinations, each combination including one light source for emitting a source signal, said source signal being a confined beam of light, and one light sensor for sensing said source signal and for providing a sensor signal in response thereto; and
a computing device arranged for processing the sensor signals to obtain data on the position of said object;
the manipulator being arranged for simultaneously transferring a first and a second object along a path, said objects being substantially flat, substantially equally sized, and substantially circular, each object having a main surface and a central axis extending perpendicular to the main surface through the center of the object, the objects being carried by the manipulator in a substantially parallel orientation, spaced apart from each other, and substantially co-axially whereby the central axis of each object may be displaced radially; and wherein said source and said sensor of a said combination are connected by a virtual line, each said source/sensor combination being positioned such that both the first and the second object intersect respective virtual lines of each combination during a transfer of said objects along said path, whereby the virtual lines include an angle with respect to the central axes of the first and second objects.

19. Apparatus according to claim 18, wherein the array of sensors is substantially linear and extending in a direction not parallel to the path.

* * * * *